United States Patent
Utamaru

(10) Patent No.: US 8,207,765 B2
(45) Date of Patent: Jun. 26, 2012

(54) SIGNAL GENERATION APPARATUS AND TEST APPARATUS

(75) Inventor: Go Utamaru, Ibaraki (JP)

(73) Assignee: Advantest Corporation, Tokyo (JP)

( * ) Notice: Subject to any disclaimer, the term of this patent is extended or adjusted under 35 U.S.C. 154(b) by 85 days.

(21) Appl. No.: 12/505,826

(22) Filed: Jul. 20, 2009

(65) Prior Publication Data

US 2011/0012659 A1    Jan. 20, 2011

(51) Int. Cl.
*H03L 7/06*    (2006.01)
(52) U.S. Cl. ........................ 327/156; 327/147
(58) Field of Classification Search .................. 327/147, 327/156

See application file for complete search history.

(56) References Cited

U.S. PATENT DOCUMENTS

| | | | | |
|---|---|---|---|---|
| 4,926,447 | A * | 5/1990 | Corsetto et al. | 375/376 |
| 2005/0231292 | A1* | 10/2005 | Akahori et al. | 331/16 |
| 2006/0041797 | A1* | 2/2006 | Miyaji | 714/700 |
| 2010/0150218 | A1* | 6/2010 | Yaginuma et al. | 375/226 |

FOREIGN PATENT DOCUMENTS

JP    2006-41640 A    2/2006

\* cited by examiner

*Primary Examiner* — Lincoln Donovan
*Assistant Examiner* — Ryan Jager
(74) *Attorney, Agent, or Firm* — Chen Yoshimura LLP

(57) ABSTRACT

Provided is a signal generating apparatus that generates an output signal having a designated phase, comprising a phase difference detecting section that outputs a control signal corresponding to a phase difference between a reference signal having a prescribed period and the output signal; an oscillating section that generates a periodic signal having a frequency corresponding to the control signal; and a phase shifting section that outputs the output signal to have a phase that is shifted from the phase of the periodic signal by a designated phase amount.

5 Claims, 5 Drawing Sheets

SIGNAL GENERATION APPARATUS AND TEST APPARATUS

BACKGROUND

1. Technical Field

The present invention relates to a signal generating apparatus and a test apparatus.

2. Related Art

Japanese Patent Application Publication No. 2006-41640 discloses a PLL circuit that adds voltage to a control voltage supplied to a VCO, according to jitter. This PLL circuit can generate a clock signal into which jitter is injected.

However, only a low-frequency voltage is supplied to the VCO, and so this PLL circuit cannot inject high-frequency jitter. Accordingly, the PLL circuit cannot apply jitter with a frequency higher than the loop band, for example.

By providing a jitter injection circuit at a stage after the PLL circuit, jitter with a frequency higher than the loop band of the PLL circuit can be injected into the clock signal. However, when providing the jitter injection circuit at a stage after the PLL circuit, propagation delay characteristics of the jitter injection circuit itself become a problem.

For example, in a jitter tolerance test for a communication interface or the like, operation of a device under test is tested by supplying the device under test with a test signal into which jitter is injected. In such a test, the test signal is supplied to the device under test at precise timings, and so it is desirable that the propagation delay characteristics of the clock generating circuit remain constant regardless of the frequency of the clock signal.

SUMMARY

Therefore, it is an object of an aspect of the innovations herein to provide a signal generating apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal generating apparatus may include a signal generating apparatus that generates an output signal having a designated phase, comprising a phase difference detecting section that outputs a control signal corresponding to a phase difference between a reference signal having a prescribed period and the output signal; an oscillating section that generates a periodic signal having a frequency corresponding to the control signal; and a phase shifting section that outputs the output signal to have a phase that is shifted from the phase of the periodic signal by a designated phase amount.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiment(s) are not necessarily essential to means provided by aspects of the invention.

Figure 1:
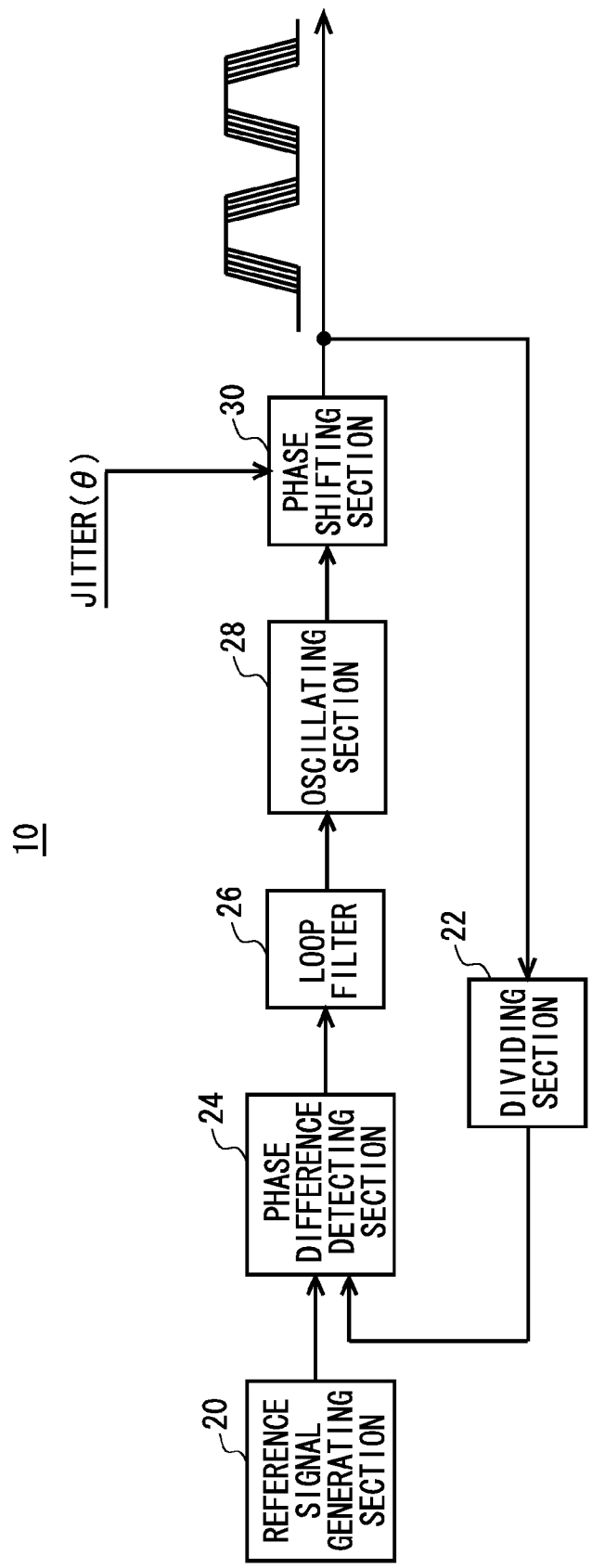
FIG. 1 shows an exemplary configuration of a signal generating apparatus 10 according to an embodiment of the present invention.

FIG. 1 shows an exemplary configuration of a signal generating apparatus 10 according to an embodiment of the present invention. The signal generating apparatus 10 of the present embodiment receives a designated phase from the outside and generates an output signal having the designated phase. In the present embodiment, the signal generating apparatus 10 receives a designated phase that changes according to injected jitter, and outputs a periodic signal into which jitter is injected as the output signal.

The signal generating apparatus 10 is provided with a reference signal generating section 20, a dividing section 22, a phase difference detecting section 24, a loop filter 26, an oscillating section 28, and a phase shifting section 30. The reference signal generating section 20 generates a reference signal having a prescribed period. The reference signal generating section 20 may be a clock generator, for example.

The dividing section 22 divides the period of the output signal from the signal generating apparatus 10. The dividing section 22 may divide the period of the output signal from the signal generating apparatus 10 into units of 1/N. Here, N may be a value greater than or equal to 1, for example.

The phase difference detecting section 24 outputs a control signal according to a phase difference between (i) a reference signal having a prescribed period generated by the reference signal generating section 20 and (ii) the output signal divided by the dividing section 22. The phase difference detecting section 24 may output the control signal with a voltage according to this phase difference, for example.

The loop filter 26 eliminates a high-band component of the control signal output from the phase difference detecting section 24. The loop filter 26 may be a low-pass filter. The loop filter 26 supplies the oscillating section 28 with the control signal from which the high-band component is removed.

The oscillating section 28 generates a periodic signal with a frequency according to the control signal from which the high-band component is removed by the loop filter 26. The oscillating section 28 may be a voltage control oscillator (VCO), for example, that changes the frequency of the periodic signal according to the voltage of the control signal supplied thereto.

The phase shifting section 30 outputs the output signal having a phase that is shifted from the phase of the periodic signal by the designated phase amount. In the present embodiment, the phase shifting section 30 receives the designated phase that changes according to the jitter to be injected into the output signal, and shifts the phase of the periodic signal by a phase amount that changes according to the jitter. In this way, the phase shifting section 30 can output the periodic signal into which jitter is injected. The phase shifting section 30 outputs the periodic signal into which jitter is injected as the output signal.

The signal generating apparatus 10 can output the output signal having a phase in synchronization with the reference signal output by the reference signal generating section 20. The signal generating apparatus 10 shifts the phase at a stage after the oscillating section 28, and can therefore change the phase of the output signal at a frequency higher than the cutoff frequency of the loop filter 26. Accordingly, the signal generating apparatus 10 can inject, into the periodic signal, jitter with a frequency higher than the cutoff frequency of the loop filter 26.

The propagation delay amount between input and output in the signal generating apparatus 10 is determined by the delay amount of the path of the dividing section 22 in the usual configuration of a PLL. Accordingly, the signal generating apparatus 10 can set the propagation delay amount between input and output to a value that remains fixed regardless of the frequency of the output signal and the propagation delay characteristics of the phase shifting section 30.

Figure 2:
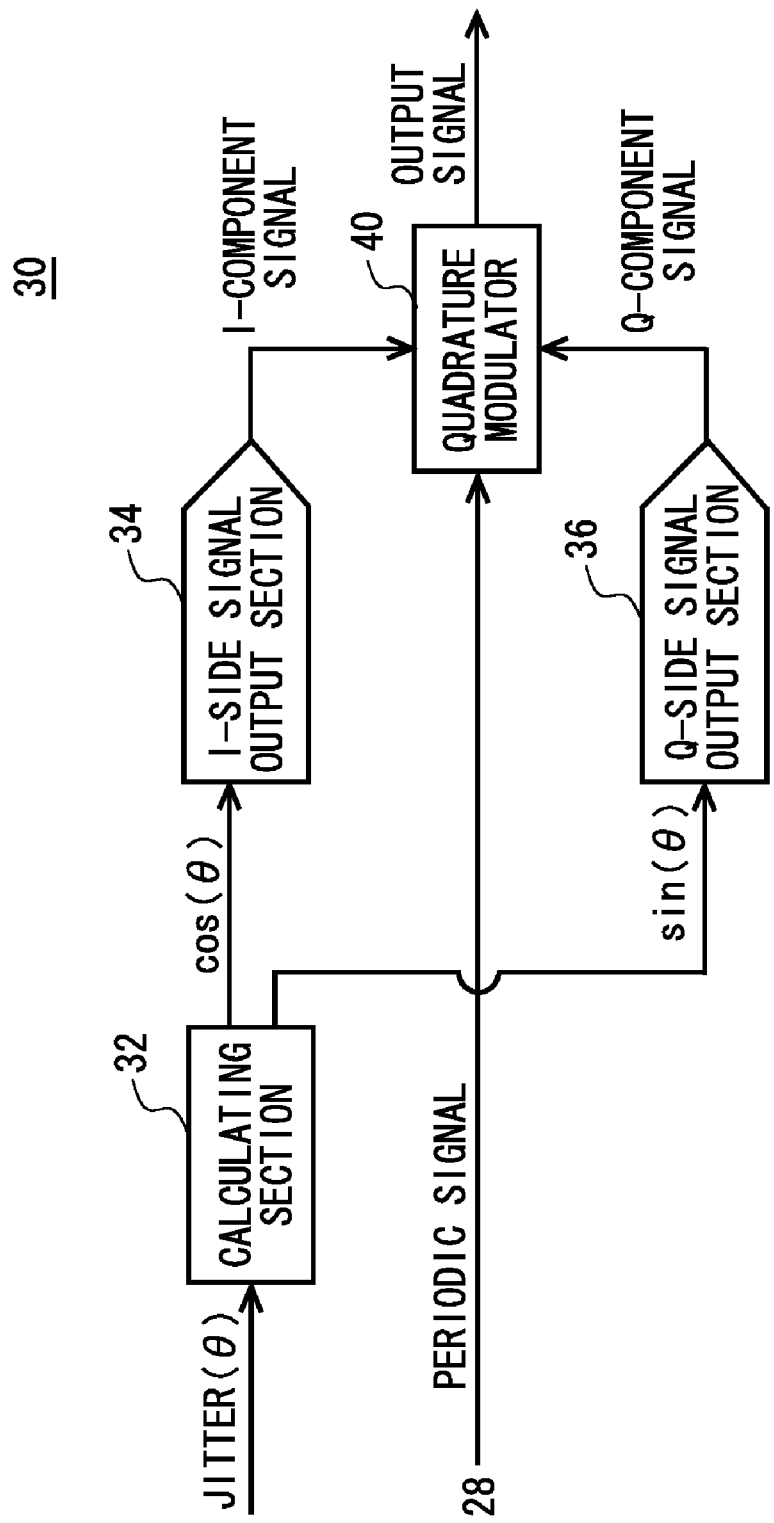
FIG. 2 shows an exemplary configuration of the phase shifting section 30 according to the present embodiment.

FIG. 2 shows an exemplary configuration of the phase shifting section 30 according to the present embodiment. The phase shifting section 30 includes a calculating section 32, an I-side signal output section 34, a Q-side signal output section 36, and a quadrature modulator 40.

The calculating section 32 receives the designated phase from the outside. The calculating section 32 outputs a sine value and a cosine value of the designated phase.

The I-side signal output section 34 outputs an I-component signal corresponding to the cosine value of the designated phase. For example, the I-side signal output section 34 outputs an analog I-component signal having a voltage or power proportional to the cosine value of the designated phase. The I-side signal output section 34 may be a DA converter that performs a digital/analog conversion on the cosine value of the designated phase.

The Q-side signal output section 36 outputs a Q-component signal corresponding to the sine value of the designated phase. For example, the Q-side signal output section 36 outputs an analog Q-component signal having an amplitude or power proportional to the sine value of the designated phase. The Q-side signal output section 36 may be a DA converter that performs a digital/analog conversion on the sine value of the designated phase.

The quadrature modulator 40 quadrature modulates the periodic signal supplied from the oscillating section 28 using the I-component signal and the Q-component signal. More specifically, the quadrature modulator 40 performs amplitude modulation on the I-component signal using a sine signal having the same period as the periodic signal, and performs amplitude modulation on the Q-component signal using a cosine signal having a phase delayed 90 degrees from the phase of the sine signal. The quadrature modulator 40 then generates the output signal by adding together (i) the I-component signal that is amplitude modulated with the sine signal and (ii) the Q-component signal that is amplitude modulated with the cosine signal. A specific configuration of the quadrature modulator 40 is described in relation to FIG. 3.

The phase shifting section 30 may be directly supplied with a cosine value and a sine value from the outside, instead of receiving the designated phase. In this case, the phase shifting section 30 does not include the calculating section 32, and so the I-side signal output section 34 receives the cosine value from the outside and the Q-side signal output section 36 receives the sine value from the outside.

The calculating section 32 may receive a delay time from the outside. In this case the calculating section 32 receives the period of the periodic signal and calculates the phase of the periodic signal corresponding to the delay time received from the outside. The calculating section 32 then calculates the cosine value and the sine value of the calculated phase.

Figure 3:
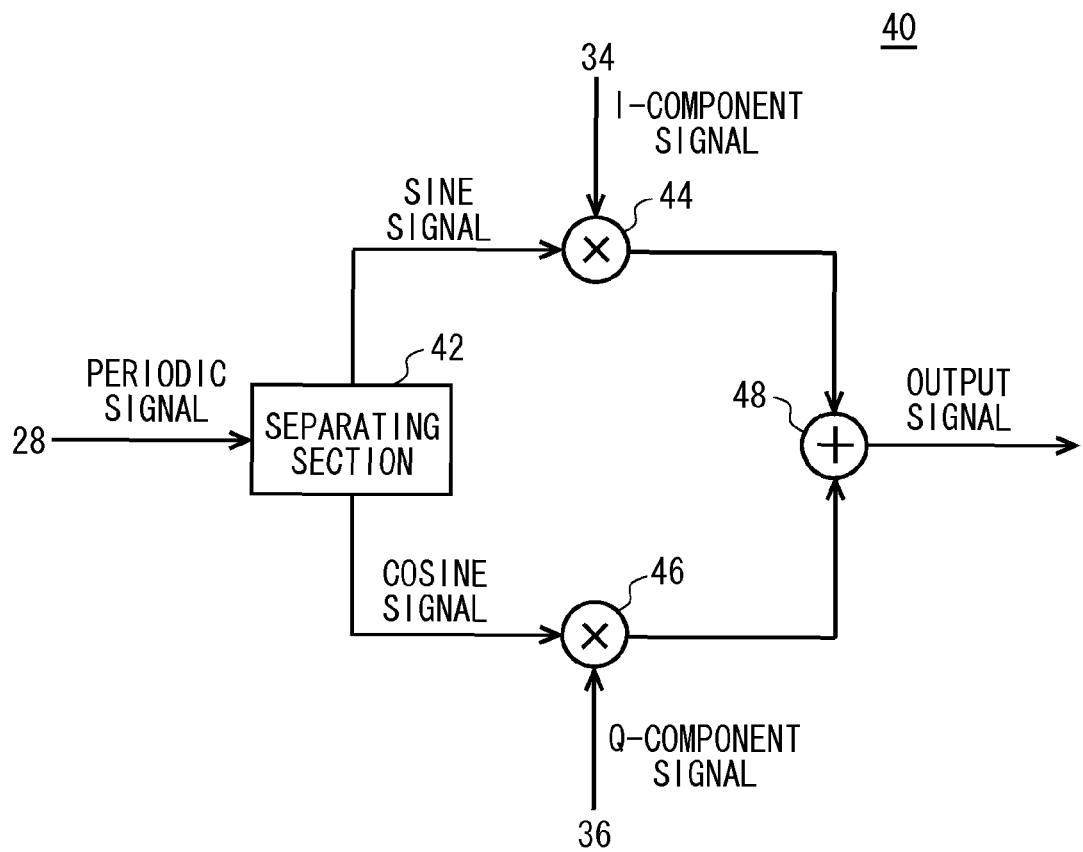
FIG. 3 shows an exemplary configuration of the quadrature modulator 40 according to the present embodiment.

FIG. 3 shows an exemplary configuration of the quadrature modulator 40 according to the present embodiment. The quadrature modulator 40 includes a separating section 42, an I-side multiplier 44, a Q-side multiplier 46, and an in-modulator adder 48.

The separating section 42 separates the periodic signal into a sine signal having the same period as the periodic signal and a cosine signal having a phase delayed by 90 degrees from the phase of the sine signal. The separating section 42 may be any of a variety of types of circuits, such as a poly-phase filter, a circuit that divides a clock having a double period to generate two signals differing in phase by 90 degrees, or the like.

The I-side multiplier 44 multiplies the sine signal by the I-component signal output by the I-side signal output section 34. The Q-side multiplier 46 multiplies the cosine signal by the Q-component signal output by the Q-side signal output section 36. The in-modulator adder 48 outputs, as the output signal, a signal obtained by adding together the signal output from the I-side multiplier 44 and the signal output from the Q-side multiplier 46.

Here, "ω" represents the angular frequency of the periodic signal, "i" represents the I-component signal, and "q" represents the Q-component signal. In this case, the output signal Y(t) can be expressed by Expression 1.

$$Y(t)=i \times \sin(\omega t)+q \times \cos(\omega t) \quad \text{Expression 1}$$

Furthermore, "θ" represents the designated phase from the outside. In this case, the I-component signal (i) becomes I×cos(θ), and the Q-component signal (q) becomes Q×sin(θ). Accordingly, the output signal Y(t) can be expressed by Expression 1'.

$$Y(t)=I \times \cos(\theta) \times \sin(\omega t)+Q \times \sin(\theta) \times \cos(\omega t) \quad \text{Expression 1'}$$

By transforming Expression 1', the output signal Y(t) can be expressed by Expression 2.

$$Y(t)=A \times \sin(\omega t+\theta) \quad \text{Expression 2}$$

In Expression 2, A represents $\sqrt{(I^2+Q^2)}$.

In this way, the signal generating apparatus 10 can output the output signal having a phase obtained by shifting the phase of the periodic signal by the designated phase amount. Furthermore, the quadrature modulator 40 can, for example, quadrature modulate the periodic signal at extremely high speeds such as several GHz. Accordingly, when the signal generating apparatus 10 of the present embodiment is used as a delay apparatus of a semiconductor test apparatus or the like, the signal generating apparatus 10 can change the delay amount by short time increments.

When the sine signal and the cosine signal output by the separating section 42 are square-wave clock signals whose levels are limited by a limiting amplifier or the like, the I-side multiplier 44 and the Q-side multiplier 46 output a staircase signal corresponding to the levels of the I-component signal and the Q-component signal supplied thereto. In this case, the signal generating apparatus 10 may be further provided with a low-pass filter for waveform shaping at a stage after the in-modulator adder 48 to eliminate a high frequency component of the output signal.

Figure 4:
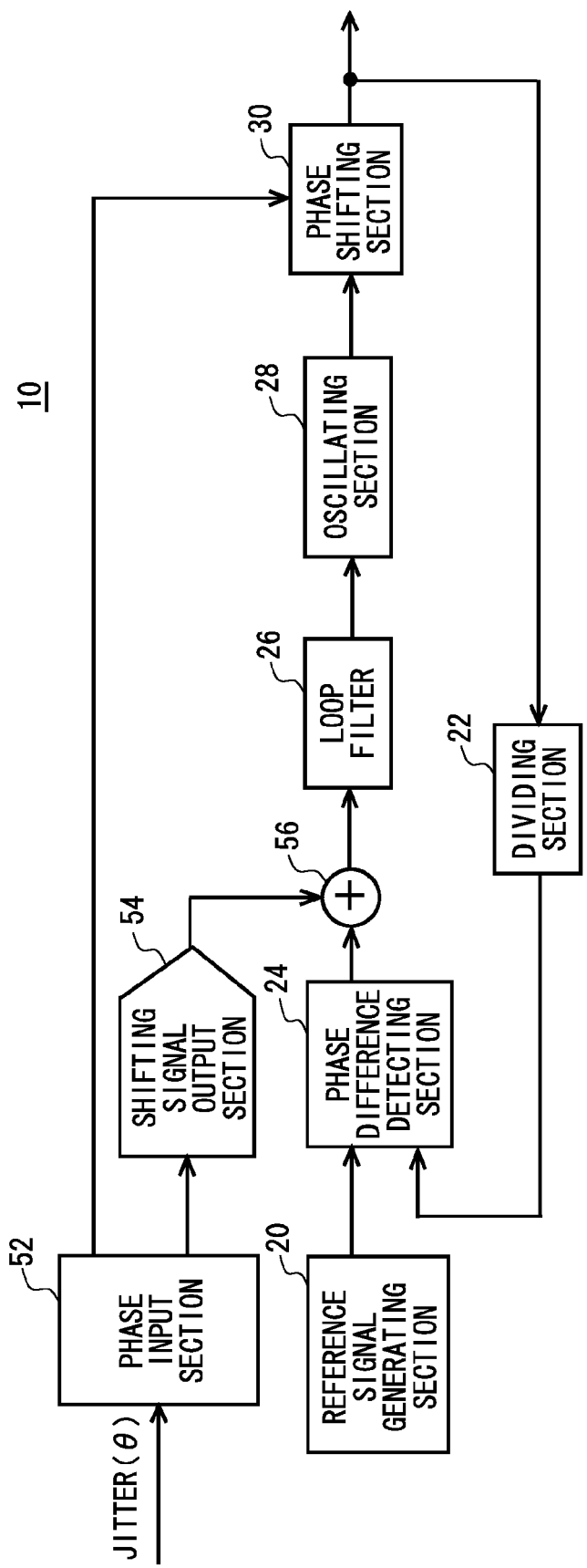
FIG. 4 shows an exemplary configuration of the signal generating apparatus 10 according to a modification of the present embodiment.

FIG. 4 shows an exemplary configuration of the signal generating apparatus 10 according to a modification of the present embodiment. The signal generating apparatus 10 according to the present modification adopts substantially the same function and configuration as the signal generating apparatus 10 described in relation to FIG. 1, and components of the signal generating apparatus 10 of the present modification have substantially the same function and configuration as the components of the signal generating apparatus 10 described in relation to FIG. 1. Therefore, the following description includes only differing points.

The signal generating apparatus 10 of the present modification further includes a phase input section 52, a shifting signal output section 54, and an adding section 56. The phase input section 52 receives a designated phase to be shifted from the outside. In the example of the present modification, the phase input section 52 receives a designated phase that changes according to the jitter to be injected into the output signal.

The phase input section 52 separates the designated phase into a component with a frequency less than or equal to the cutoff frequency of the loop filter 26 and a component with a frequency greater than the cutoff frequency of the loop filter 26. The phase input section 52 supplies the shifting signal output section 54 with the component having a frequency less than or equal to the cutoff frequency of the loop filter 26 included in the designated phase. The phase input section 52 supplies the phase shifting section 30 with the component having a frequency greater than the cutoff frequency of the loop filter 26 included in the designated phase.

The shifting signal output section 54 outputs a phase signal corresponding to the phase supplied thereto. For example, the shifting signal output section 54 outputs an analog phase signal having a voltage or power corresponding to the phase supplied thereto. In the present modification, the shifting signal output section 54 is a DA converter that outputs the phase signal having a current corresponding to the phase supplied thereto.

The adding section 56 adds the phase signal output from the shifting signal output section 54 to the control signal output from the phase difference detecting section 24, and supplies the resulting signal to the loop filter 26. In the present modification, the phase difference detecting section 24 outputs the control signal having a current corresponding to the phase difference. The adding section 56 adds together the currents of the phase signal output by the shifting signal output section 54 and the control signal output by the phase difference detecting section 24. The loop filter 26 receives the control signal from the adding section 56 instead of receiving the control signal from the phase difference detecting section 24.

The phase shifting section 30 shifts the phase of the periodic signal output from the oscillating section 28 by the phase amount supplied from the phase input section 52. The oscillating section 28 outputs the periodic signal having the shifted phase as the output signal.

The signal generating apparatus 10 of the present modification described above can inject the component of the jitter to be injected having a frequency less than or equal to the cutoff frequency of the loop filter 26 at a stage prior to the loop filter 26, and can inject the component of the jitter to be injected having a frequency greater than the cutoff frequency of the loop filter 26 at a stage after the oscillating section 28. In this way, the signal generating apparatus 10 of the present modification can inject wideband jitter into the periodic signal.

The loop filter 26 may be controlled by an external control apparatus or the like to have the cutoff frequency thereof changed according to the frequency of the injected jitter. In this way, when the phase shifting section 30 injects the jitter, the signal generating apparatus 10 can reliably set the band of the injected jitter to be outside of the loop band. Furthermore, when the shifting signal output section 54 injects the jitter, the signal generating apparatus 10 can reliably set the band of the injected jitter to be within the loop band.

Figure 5:
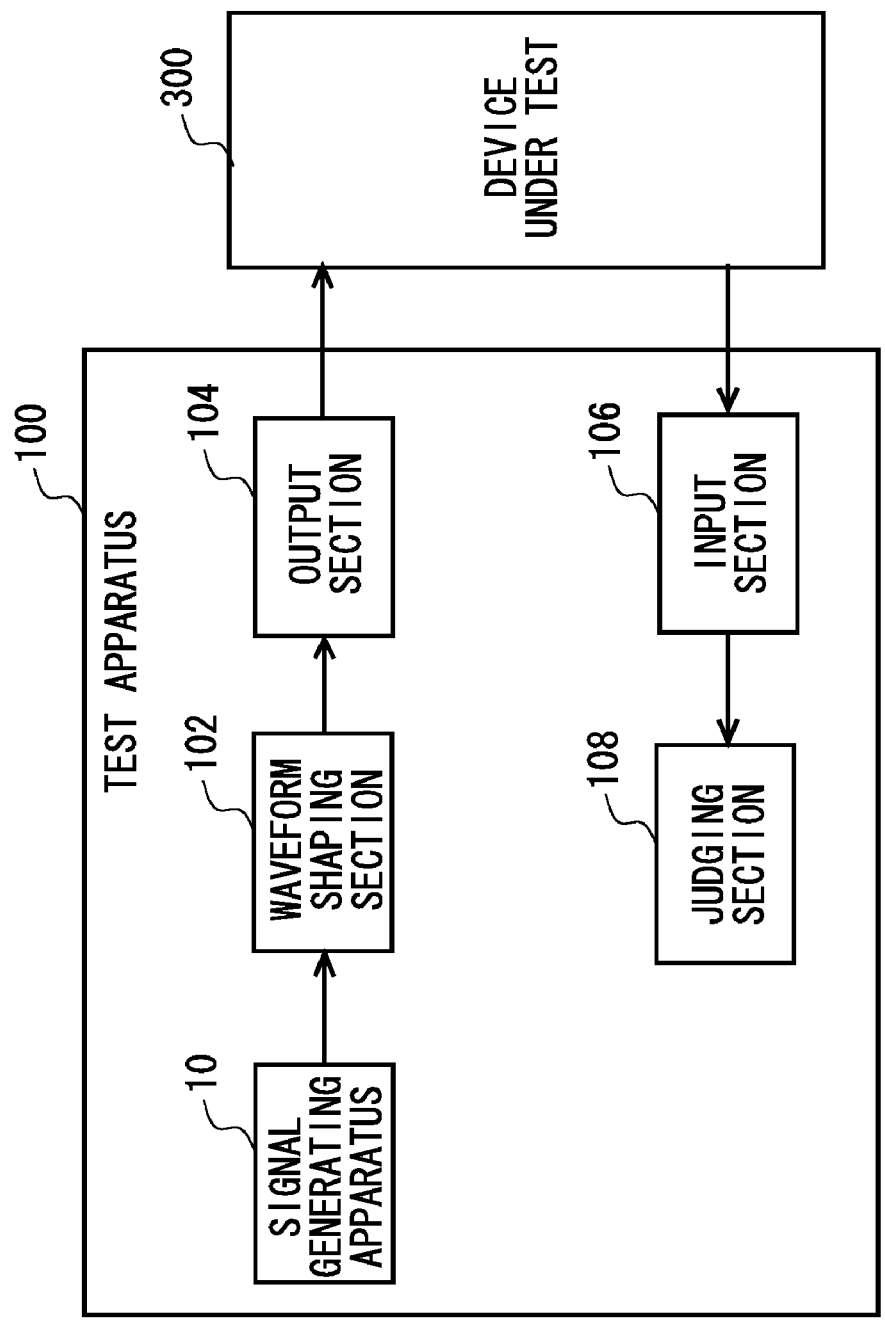
FIG. 5 shows an exemplary configuration of a test apparatus 100 according to an embodiment of the present invention, along with a device under test 300.

FIG. 5 shows an exemplary configuration of a test apparatus 100 according to an embodiment of the present invention, along with a device under test 300. The test apparatus 100 of the present embodiment tests the device under test 300. The test apparatus 100 includes the signal generating apparatus 10, a waveform shaping section 102, an output section 104, an input section 106, and a judging section 108.

The signal generating apparatus 10 generates a signal having a prescribed period into which jitter is injected. This signal generating apparatus 10 may be the same as the signal generating apparatus 10 described in relation to FIGS. 1 to 4.

The waveform shaping section 102 shapes a waveform of a test signal supplied to the device under test 300, based on the signal having the prescribed period into which jitter is injected output by the signal generating apparatus 10. More specifically, the waveform shaping section 102 shapes a waveform having a pattern designated by the pattern generator at the timing of the signal output by the signal generating apparatus 10. The output section 104 supplies the signal having the waveform shaped by the waveform shaping section 102 to the device under test 300 as the test signal.

The input section 106 receives a response signal output from the device under test 300. More specifically, the input section 106 acquires a logic value of the response signal output from the device under test 300 according to a strobe timing. The input section 106 may acquire the logic value of the response signal according to a timing of the signal into which jitter is injected output by the signal generating apparatus 10. The judging section 108 judges acceptability of the device under test 300 by comparing the value of the response signal received by the input section 106 to an expected value designated by the pattern generator.

The test apparatus 100 can supply the device under test 300 with a test signal into which jitter is injected to perform a jitter tolerance test or the like of the device under test 300. Furthermore, since the propagation delay characteristic of the signal generating apparatus 10 is constant regardless of the period of the test signal supplied to the device under test 300, the test apparatus 100 can precisely control the timing at which the test signal is applied to the device under test 300. Yet further, since the signal generating apparatus 10 can generate the periodic signal into which is injected jitter having a frequency higher than the loop band, the test apparatus 100 can perform a variety of tests on the device under test 300.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal generating apparatus that generates an output signal having a designated phase, comprising:
    a phase difference detecting section that outputs a control signal corresponding to a phase difference between a reference signal having a prescribed period and the output signal;
    a loop filter that eliminates a high-band component of the control signal;
    an oscillating section that generates a periodic signal having a frequency corresponding to the control signal from which the high-band component has been eliminated by the loop filter; and
    a phase shifting section that outputs the output signal to have a phase that is shifted from the phase of the periodic signal by a designated phase amount, wherein
    the phase shifting section includes:
        an I-side signal output section that outputs an I-component signal corresponding to a cosine value of the designated phase;
        a Q-side signal output section that outputs a Q-component signal corresponding to a sine value of the designated phase; and
        a quadrature modulator that quadrature modulates the periodic signal with the I-component signal and the Q-component signal,
    the signal generating apparatus further comprises:
    a phase input section that receives a designated phase shift and supplies the phase shifting section with a component, included in the designated phase, having a frequency higher than a cutoff frequency of the loop filter;
    a shifting signal output section that outputs a phase signal according to a phase supplied thereto; and
    an adding section that adds the phase signal to the control signal output by the phase difference detecting section, and supplies the resulting signal to the loop filter, wherein
    the phase input section supplies the shifting signal output section with a component, included in the designated phase, having a frequency less than or equal to the cutoff frequency of the loop filter.

2. The signal generating apparatus according to claim 1, wherein
    the phase input section receives a designated phase that changes according to jitter with which the output signal is to be modulated.

3. A test apparatus that tests a device under test, comprising:
    a signal generating apparatus that generates an output signal having a designated phase, the signal generating apparatus comprising:
        a phase difference detecting section that outputs a control signal corresponding to a phase difference between a reference signal having a prescribed period and the output signal;
        a loop filter that eliminates a high-band component of the control signal;
        an oscillating section that generates a periodic signal having a frequency corresponding to the control signal from which the high-band component has been eliminated by the loop filter; and
        a phase shifting section that outputs the output signal to have a phase that is shifted from the phase of the periodic signal by a designated phase amount, the phase shifting section including:
            an I-side signal output section that outputs an I-component signal corresponding to a cosine value of the designated phase;
            a Q-side signal output section that outputs a Q-component signal corresponding to a sine value of the designated phase; and
            a quadrature modulator that quadrature modulates the periodic signal with the I-component signal and the Q-component signal, the signal generating apparatus further comprising:
        a phase input section that receives a designated phase shift and supplies the phase shifting section with a component, included in the designated phase, having a frequency higher than a cutoff frequency of the loop filter;
        a shifting signal output section that outputs a phase signal according to a phase supplied thereto; and
        an adding section that adds the phase signal to the control signal output by the phase difference detecting section, and supplies the resulting signal to the loop filter, wherein
    the phase input section supplies the shifting signal output section with a component, included in the designated phase, having a frequency less than or equal to the cutoff frequency of the loop filter, the test apparatus further comprising:
    a waveform shaping section that shapes a waveform of a test signal supplied to the device under test, based on the output signal of the signal generating apparatus.

4. The test apparatus according to claim 3, wherein the quadrature modulator includes:
    a separating section that separates the periodic signal into (i) a sine signal having a phase identical to that of the periodic signal and (ii) a cosine signal having a phase delayed 90 degrees from the phase of the periodic signal;
    an I-side multiplier that multiplies the I-component signal by the sine signal;
    a Q-side multiplier that multiplies the Q-component signal by the cosine signal; and
    an in-modulator adder that outputs, as the output signal, a signal obtained by adding together a signal output by the I-side multiplier and a signal output by the Q-side multiplier.

5. The test apparatus according to claim 3, wherein
    the phase input section receives a designated phase that changes according to jitter with which the output signal is to be modulated.

* * * * *